United States Patent
Lin et al.

(10) Patent No.: US 11,127,699 B2
(45) Date of Patent: Sep. 21, 2021

(54) CHIP PACKAGE STRUCTURE AND MANUFACTURING METHOD THEREOF

(71) Applicant: Powertech Technology Inc., Hsinchu County (TW)

(72) Inventors: Nan-Chun Lin, Hsinchu County (TW); Hung-Hsin Hsu, Hsinchu County (TW); Shang-Yu Chang Chien, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 16/830,235

(22) Filed: Mar. 25, 2020

(65) Prior Publication Data

US 2020/0328161 A1    Oct. 15, 2020

Related U.S. Application Data

(60) Provisional application No. 62/831,730, filed on Apr. 10, 2019.

(51) Int. Cl.
*H01L 23/66* (2006.01)
*H01L 23/538* (2006.01)
(Continued)

(52) U.S. Cl.
CPC .......... *H01L 23/66* (2013.01); *H01L 21/4853* (2013.01); *H01L 21/4857* (2013.01);
(Continued)

(58) Field of Classification Search
CPC ... H01L 25/105; H01L 25/50; H01L 25/0657; H01L 2225/1035; H01L 2225/1041;
(Continued)

(56) References Cited

U.S. PATENT DOCUMENTS

2002/0074637 A1* 6/2002 McFarland ......... H01L 23/3107
                                                    257/686
2015/0371936 A1* 12/2015 Chen .................. H01L 23/5389
                                                    257/774
(Continued)

FOREIGN PATENT DOCUMENTS

TW      201721828      6/2017
WO      2017034641     3/2017

OTHER PUBLICATIONS

Office Action of Taiwan Counterpart Application, dated Jun. 4, 2021, pp. 1-4.

*Primary Examiner* — Kyoung Lee
*Assistant Examiner* — Christina A Sylvia
(74) *Attorney, Agent, or Firm* — JCIPRNET

(57) ABSTRACT

A chip package structure including a first chip, an encapsulant, a first redistribution layer, a second redistribution layer, a second chip, and a third chip is provided. The first chip has an active surface, a back side surface opposite to the active surface, a plurality of conductive vias, and a plurality of conductive connectors disposed on the back side surface. The encapsulant covers the active surface, the back side surface, and the conductive connectors. The encapsulant has a first encapsulating surface and a second encapsulating surface opposite to the first encapsulating surface. The first redistribution layer is disposed on the first encapsulating surface. The second redistribution layer is disposed on the second encapsulating surface. The second chip is disposed on the second redistribution layer. The third chip is disposed on the second redistribution layer. A manufacturing method of a chip package structure is also provided.

18 Claims, 15 Drawing Sheets

(51) Int. Cl.
  H01L 23/00    (2006.01)
  H01L 21/48    (2006.01)
  H01L 21/56    (2006.01)
  H01L 21/683   (2006.01)
  H01Q 1/22     (2006.01)
  H01L 23/31    (2006.01)
  H01L 25/10    (2006.01)
  H01L 25/00    (2006.01)
  H01L 21/78    (2006.01)
  H01L 23/552   (2006.01)

(52) U.S. Cl.
  CPC .......... *H01L 21/561* (2013.01); *H01L 21/565* (2013.01); *H01L 21/568* (2013.01); *H01L 21/6835* (2013.01); *H01L 21/78* (2013.01); *H01L 23/3128* (2013.01); *H01L 23/5383* (2013.01); *H01L 23/5386* (2013.01); *H01L 23/5389* (2013.01); *H01L 23/552* (2013.01); *H01L 24/19* (2013.01); *H01L 24/20* (2013.01); *H01L 24/96* (2013.01); *H01L 25/105* (2013.01); *H01L 25/50* (2013.01); *H01Q 1/2283* (2013.01); *H01L 2221/68372* (2013.01); *H01L 2223/6677* (2013.01); *H01L 2224/214* (2013.01); *H01L 2224/95001* (2013.01); *H01L 2225/1035* (2013.01); *H01L 2225/1041* (2013.01); *H01L 2225/1058* (2013.01); *H01L 2924/3025* (2013.01); *H01L 2924/3511* (2013.01)

(58) Field of Classification Search
  CPC ... H01L 2225/1058; H01L 2224/95001; H01L 2224/214; H01L 2224/73204; H01L 2224/32225; H01L 2224/16225; H01L 2224/1308; H01L 2221/68372; H01L 2221/68359; H01L 2221/68345; H01L 2223/6677; H01L 2924/3025; H01L 2924/3511; H01L 24/96; H01L 24/20; H01L 24/19; H01L 24/97; H01L 23/66; H01L 23/552; H01L 23/5386; H01L 23/5389; H01L 23/5383; H01L 23/3128; H01L 23/49822; H01L 23/3107; H01L 23/3121
  See application file for complete search history.

(56) References Cited

U.S. PATENT DOCUMENTS

| | | | |
|---|---|---|---|
| 2016/0260684 A1* | 9/2016 | Zhai | ...................... H01L 21/568 |
| 2017/0170155 A1* | 6/2017 | Yu | ...................... H01L 23/3675 |
| 2018/0204791 A1 | 7/2018 | Chen et al. | |
| 2018/0366436 A1 | 12/2018 | Wang et al. | |

\* cited by examiner

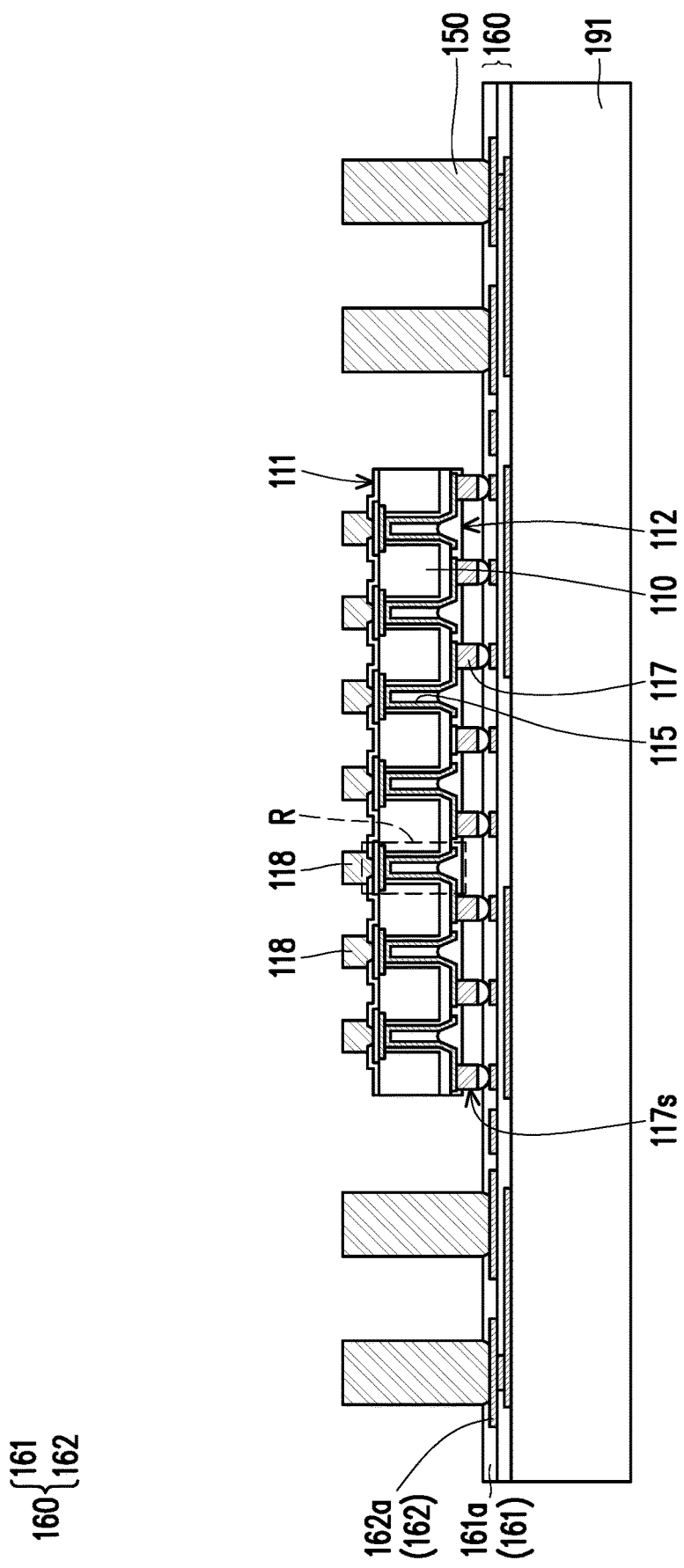

CHIP PACKAGE STRUCTURE AND MANUFACTURING METHOD THEREOF

CROSS-REFERENCE TO RELATED APPLICATION

This application claims the priority benefits of U.S. provisional application Ser. No. 62/831,730, filed on Apr. 10, 2019. The entirety of the above-mentioned patent application is hereby incorporated by reference herein and made a part of this specification.

BACKGROUND

Technical Field

The disclosure relates to a chip package structure and a manufacturing method thereof, and in particular to a chip package structure having a plurality of chips and a manufacturing method thereof.

Description of Related Art

In order to make electronic products, light, thin, compact, and small-sized, semiconductor packaging technology has also been under progressive development to offer products that meet the demands of being small-sized, light-weighted, compact, and highly competitive on the market.

However, in a chip package structure having a plurality of chips, how to facilitate the signal transmission quality or efficiency between the chips has become an issue to work on.

SUMMARY

The disclosure provides a chip package structure having favorable signal transmission quality or efficiency and a manufacturing method of the chip package structure.

The chip package structure of the disclosure includes a first chip, an encapsulant, a first redistribution layer, a second redistribution layer, a second chip, and a third chip. The first chip has a first active surface, a first back side surface opposite to the first active surface, a plurality of conductive vias, and a plurality of first conductive connectors located on the back side surface. The encapsulant covers the first active surface, the first back side surface, and the conductive connectors of the first chip. The encapsulant has a first encapsulating surface and a second encapsulating surface opposite to the first encapsulating surface. The first redistribution layer is located on the first encapsulating surface of the encapsulant. The second redistribution layer is located on the second encapsulating surface of the encapsulant. The second chip is disposed on the second redistribution layer. The third chip is disposed on the second redistribution layer.

The manufacturing method of the chip package structure of the disclosure includes the following steps: forming a first redistribution layer on a carrier substrate; disposing a first chip on the first redistribution layer, the first chip having a first active surface, a first back side surface opposite to the active surface, a plurality of conductive vias, and a plurality of first conductive connectors located on the first back side surface, and the first conductive connectors being electrically connected to the first redistribution layer; forming an encapsulant on the first redistribution layer, the encapsulant covering the first active surface, the first back side surface, and the first conductive connectors of the first chip; forming a second redistribution layer on the encapsulant; disposing a second chip on the second redistribution layer; and disposing a third chip on the second redistribution layer.

Based on the above, the chip package structure and the manufacturing method of the chip package structure of the disclosure can facilitate the signal transmission quality or efficiency.

To make the features and advantages of the disclosure clear and easy to understand, the following gives a detailed description of embodiments with reference to accompanying drawings.

BRIEF DESCRIPTION OF THE DRAWINGS

FIG. 1A to FIG. 1G are schematic partial cross-sectional views illustrating part of a manufacturing method of a chip package structure according to a first embodiment of the disclosure.

DESCRIPTION OF THE EMBODIMENTS

Figure 1A:
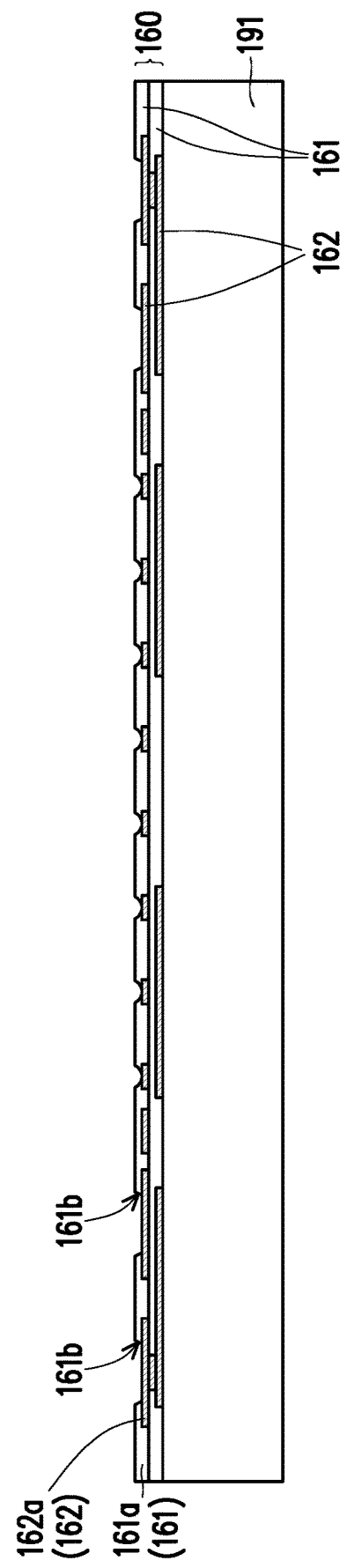

As used herein, the directional terms (such as above, below, left, right, front, back, top, and bottom) are merely used for ease of understanding the drawings and are not intended to indicate absolute directions.

Unless otherwise particularly stated, any method described herein is not intended to be construed as implementing steps in a particular order.

The present disclosure will be fully explained with reference to the drawings of the embodiments. However, the present disclosure may also be embodied in various different forms and should not be limited to the embodiments described in the specification. Thicknesses and sizes of layers or regions may be enlarged for clarity. Same or like reference numerals are used to indicate same or like elements. Details may be omitted in the description of the following sections.

FIG. 1A to FIG. 1G are schematic partial cross-sectional views illustrating part of a manufacturing method of a chip package structure according to a first embodiment of the disclosure. FIG. 1H is a schematic partial top view of the chip package structure according to the first embodiment of the disclosure. FIG. 1I is a partial cross-sectional schematic view illustrating part of the manufacturing method of the chip package structure according to the first embodiment of the disclosure. FIG. 1H may be a top schematic view of FIG. 1G. FIG. 1I may be an enlarged schematic view of a region R in FIG. 1C.

With reference to FIG. 1A, a first redistribution layer 160 is formed on a carrier substrate 191. The disclosure has no special limitation on the carrier substrate 191 as long as the carrier substrate 191 can be adapted to carry a layer formed thereon or a component disposed thereon.

In an embodiment not shown, the carrier substrate 191 may have a light to heat conversion (LTHC) adhesive layer or other similar release layer thereon.

In the present embodiment, the first redistribution layer 160 may include insulating layers 161 and conductive layers 162. A topmost insulating layer 161a (i.e., the insulating layer 161 farthest from the carrier substrate 191) may have a plurality of openings 161b, and the openings 161b may expose a topmost conductive layer 162a (i.e., the conductive layer 162 farthest from the carrier substrate 191). The first redistribution layer 160 may be formed by a commonly used semiconductor process (such as a deposition process, a photolithography process, and/or an etching process), which is omitted herein.

Figure 1B:
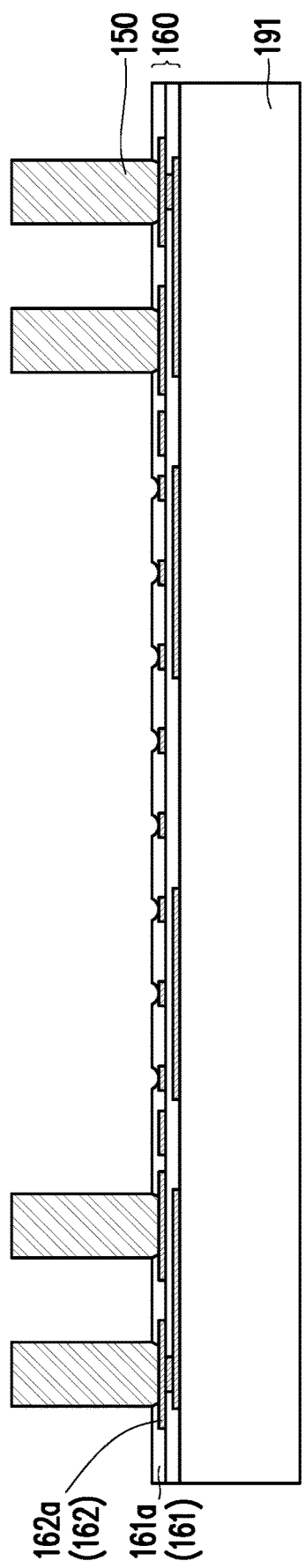

With reference to FIG. 1B, in the present embodiment, a plurality of third conductive connectors 150 may be disposed on the first redistribution layer 160. The third conductive connectors 150 may be embedded in the openings 161b (shown in FIG. 1A) of the topmost insulating layer 161a, and electrically connected to corresponding portions in the topmost conductive layer 162a.

In an embodiment, the third conductive connector 150 may include a pre-formed conductive member. For example, the third conductive connector 150 may include a pre-formed conductive pillar, but the disclosure is not limited thereto.

In an embodiment, the third conductive connectors 150 may be formed by a commonly used semiconductor process (such as a photolithography process, a sputtering process, an electroplating process, and/or an etching process), but the disclosure is not limited thereto. For example, the third conductive connector 150 may include a plating core layer and a seed layer surrounding the plating core layer, but the disclosure is not limited thereto.

With reference to FIG. 1C, a first chip 110 is disposed on the first redistribution layer 160.

The first chip 110 includes a substrate 113. The substrate 113 has a component region (not shown) on one side, and a surface on which the component region is located may be referred to as an active surface. That is, the first chip 110 has a first active surface 111 and a first back side surface 112, and the first back side surface 112 is opposite to the first active surface 111.

In the present embodiment, the first chip 110 may include a plurality of connection pads 116, a circuit structure 114, a plurality of first conductive connectors 117, a plurality of second conductive connectors 118, and a plurality of conductive vias 115. The connection pads 116 are located on the first active surface 111. The first conductive connectors 117 are located on the first back side surface 112. The second conductive connectors 118 are located on the first active surface 111. The conductive vias 115 penetrate through the substrate 113. Besides, after the first chip 110 is disposed on the first redistribution layer 160, the first conductive connectors 117 may be electrically connected to the first redistribution layer 160.

It is worth noting that in FIG. 1C and subsequent drawings, only a portion of the cross section is exemplarily shown. In a general chip design, components in the component region (for example, components in the component region of the first chip 110) may be electrically connected to the corresponding connection pads (for example, a portion of the connection pads 116 of the first chip 110) through a corresponding back end of line interconnect.

In the present embodiment, one of the first conductive connectors 117 and one of the second conductive connectors 118 may be electrically connected through the corresponding connection pad 116, the corresponding conductive via 115, and a corresponding portion of the circuit conductive layer 114b. In an embodiment, the conductive via 115 may be electrically connected to the corresponding connection pad 116 through a corresponding back end of line interconnect.

In the present embodiment, the connection pad 116 is, for example, an aluminum pad or a copper pad, but the disclosure is not limited thereto. In an embodiment, the connection pad 116 may be partially covered by a passivation layer 119.

In the present embodiment, the circuit structure 114 may include circuit insulating layers 114a, 114c and a circuit conductive layer 114b. The circuit insulating layer 114a may be located between the circuit conductive layer 114b and the substrate 113. The circuit insulating layer 114c may cover the circuit conductive layer 114b.

In the present embodiment, the conductive via 115 may include a via insulating layer 115a and a via conductive layer 115b. The via insulating layer 115a may be located between the via conductive layer 115b and the substrate 113.

In an embodiment, the via conductive layer 115b may be of a multilayer structure. For example, the via conductive layer 115b may include a barrier layer, a seed layer, and a plating layer, but the disclosure is not limited thereto.

In the present embodiment, the circuit insulating layer 114a and the via insulating layer 115a closest to the substrate 113 may be a same layer, and the circuit conductive layer 114b and the via conductive layer 115b closest to the substrate 113 may be a same layer.

In an embodiment, the substrate 113 may be a silicon substrate, and the conductive via 115 may be referred to as a through silicon via (TSV), but the disclosure is not limited thereto.

Figure 1D:
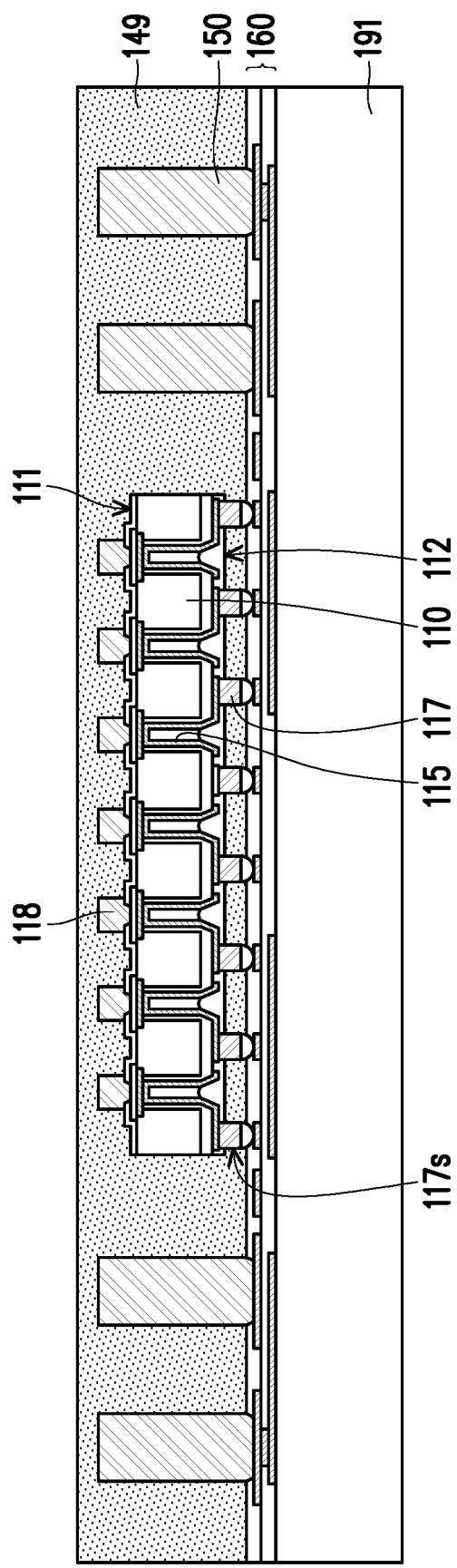

With reference to FIG. 1D, in the present embodiment, an encapsulating material 149 may be formed on the first redistribution layer 160. The encapsulating material 149 covers the first active surface 111, the first back side surface 112, the first conductive connectors 117, the second conductive connectors 118, and the third conductive connectors 150 of the first chip 110.

Figure 1E:
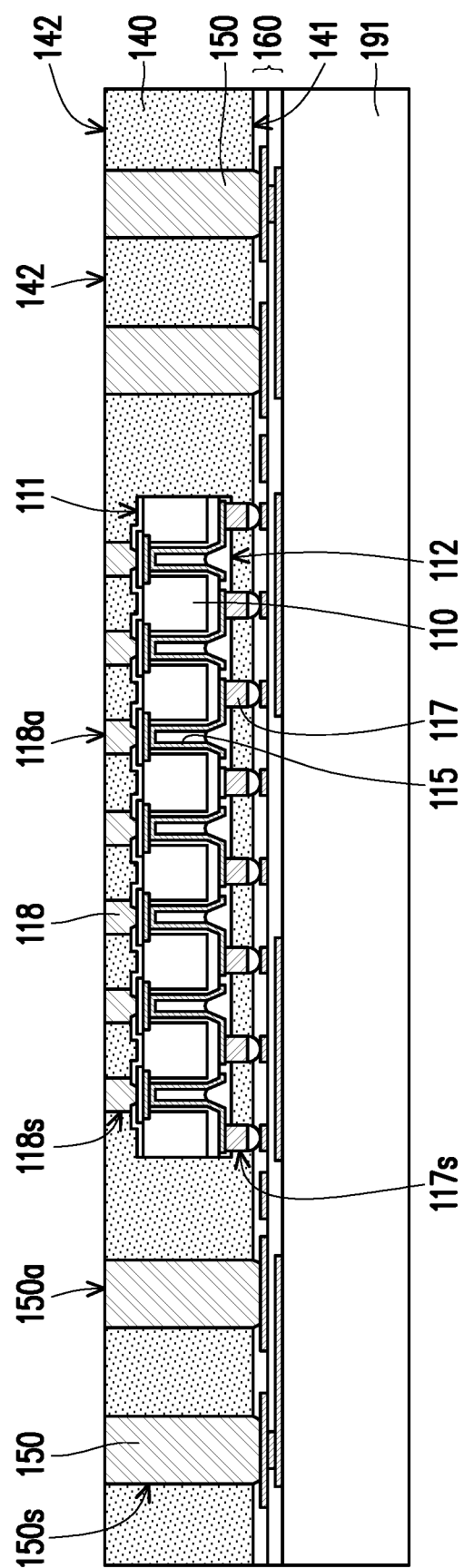

With reference to FIG. 1E, in the present embodiment, a portion of the encapsulating material 149 (shown in FIG. 1D) may be removed to form an encapsulant 140. The encapsulant 140 may cover the first active surface 111, the first back side surface 112, side walls 117s of the first conductive connectors 117, side walls 118s of the second conductive connectors 118, and side walls 150s of the third conductive connectors 150 of the first chip 110. The encapsulant 140 may expose a portion of the second conductive connectors 118 and a portion of the third conductive connectors 150.

In an embodiment, grinding, polishing, or other suitable planarization steps may be performed to enable a second surface 142 of the encapsulant 140, top surfaces 118a of the second conductive connectors 118, and top surfaces 150a of the third conductive connectors 150 to constitute a coplanar flat surface.

In an embodiment, since the first active surface 111 of the first chip 110 has the second conductive connectors 118 thereon, the possibility of damage to the components of the component region or the connection pads 116 (shown in FIG. 1I) can be reduced when the aforementioned planarization step is performed.

Figure 1F:
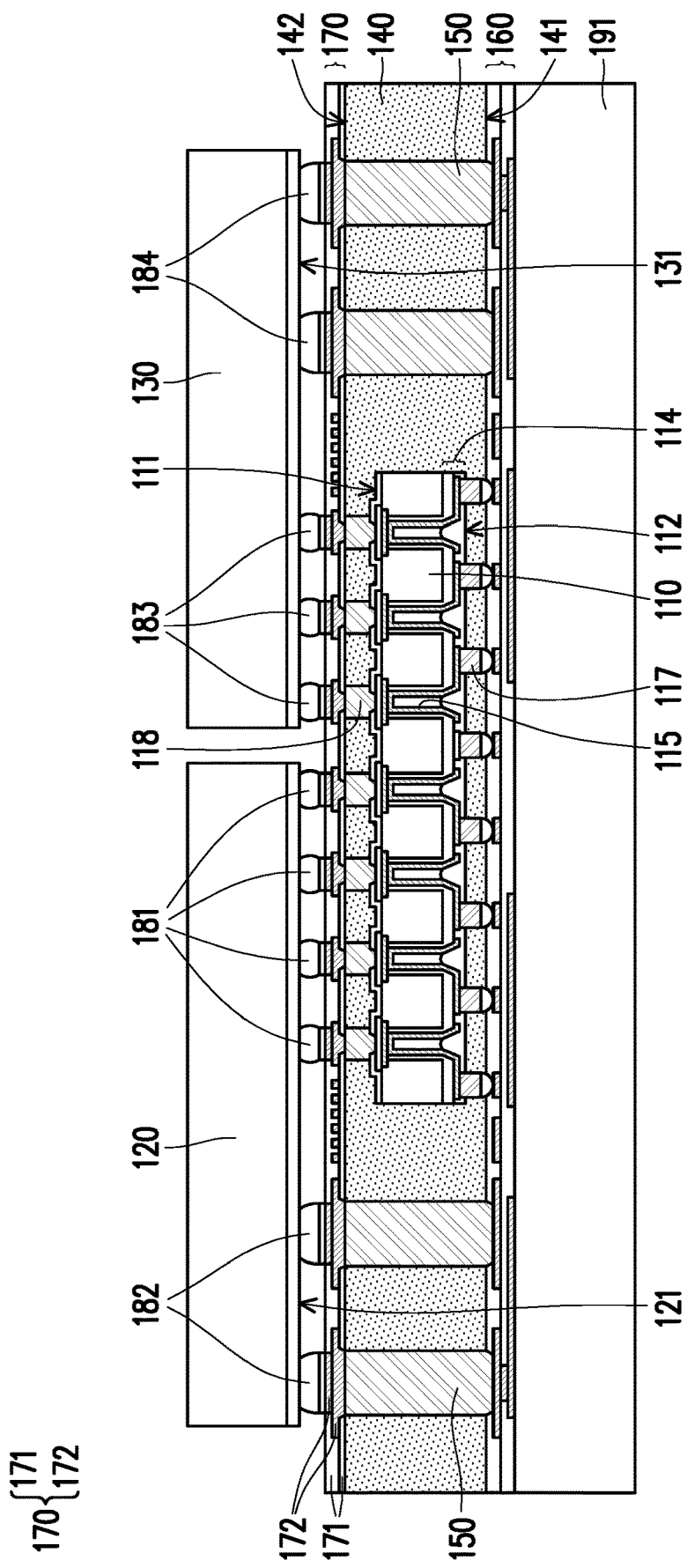

With reference to FIG. 1F, a second redistribution layer 170 is formed on the encapsulant 140.

In the present embodiment, the second redistribution layer 170 may include an insulating layer 171 and a conductive layer 172. The second redistribution layer 170 may be formed by a commonly used semiconductor process (such as a deposition process and/or a photolithography process), which is omitted herein.

With continued reference to FIG. 1F, a second chip 120 is disposed on the second redistribution layer 170, and the second chip 120 is electrically connected to corresponding portions in the conductive layer 172 and the corresponding third conductive connectors 150.

In the present embodiment, there may be a plurality of first conductive terminals 181 and a plurality of second conductive terminals 182 between the second chip 120 and the second redistribution layer 170. The second chip 120 may be electrically connected to the first chip 110 through the corresponding first conductive terminals 181. The second chip 120 may be electrically connected to the corresponding third conductive connectors 150 through the corresponding second conductive terminals 182.

With continued reference to FIG. 1F, a third chip 130 is disposed on the second redistribution layer 170, and the third chip 130 is electrically connected to corresponding portions in the conductive layer 172 and the corresponding third conductive connectors 150.

In the present embodiment, there may be a plurality of third conductive terminals 183 and a plurality of fourth conductive terminals 184 between the third chip 130 and the second redistribution layer 170. The third chip 130 may be electrically connected to the first chip 110 through the corresponding third conductive terminals 183. The third chip 130 may be electrically connected to the corresponding third conductive connectors 150 through the corresponding fourth conductive terminals 184.

In an embodiment, the first conductive terminals 181, the second conductive terminals 182, the third conductive terminals 183, and/or the fourth conductive terminals 184 may include solder balls, but the disclosure is not limited thereto.

In an embodiment, the first conductive terminals 181, the second conductive terminals 182, the third conductive terminals 183, and/or the fourth conductive terminals 184 may be formed by a commonly used ball mounting process, which is omitted herein.

It is worth noting that the disclosure does not limit a sequence in which the second chip 120 is disposed on the second redistribution layer 170 and the third chip 130 is disposed on the second redistribution layer 170.

In an embodiment not shown, an underfill may be formed between the second chip 120 and the second redistribution layer 170 and/or between the third chip 130 and the second redistribution layer 170.

Figure 1G:
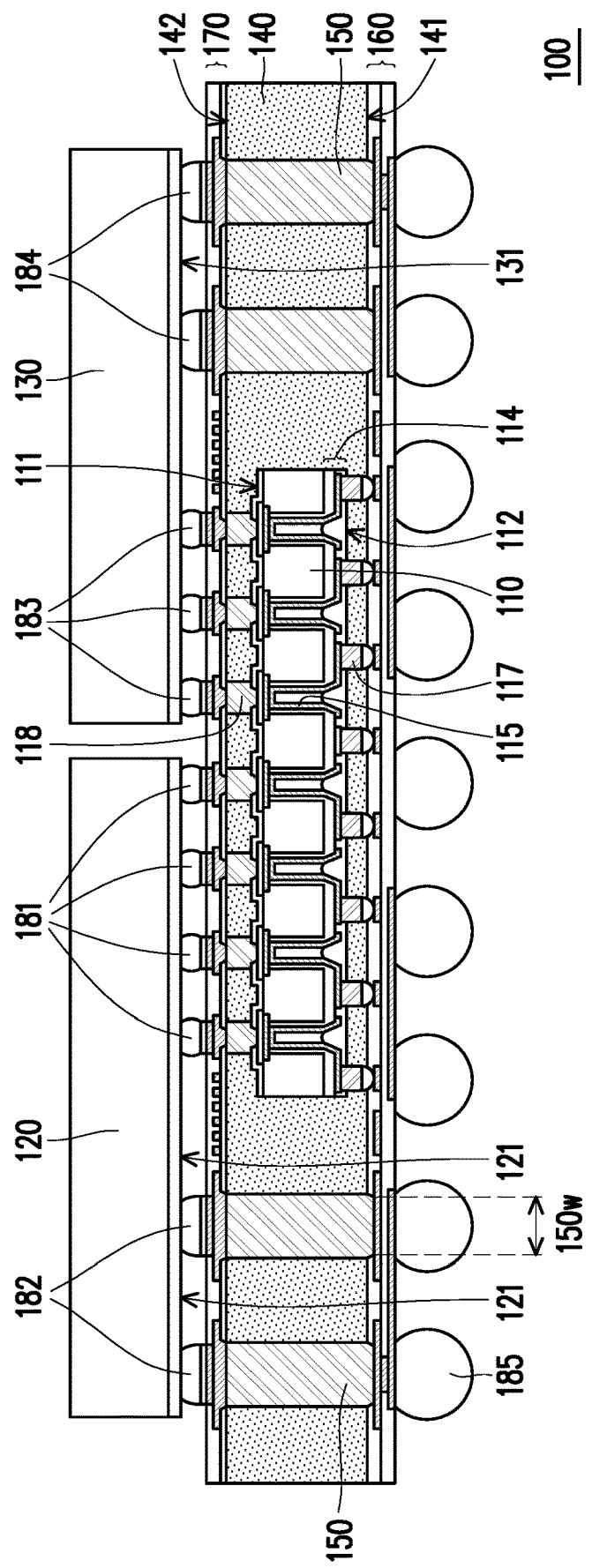
Figure 1H:
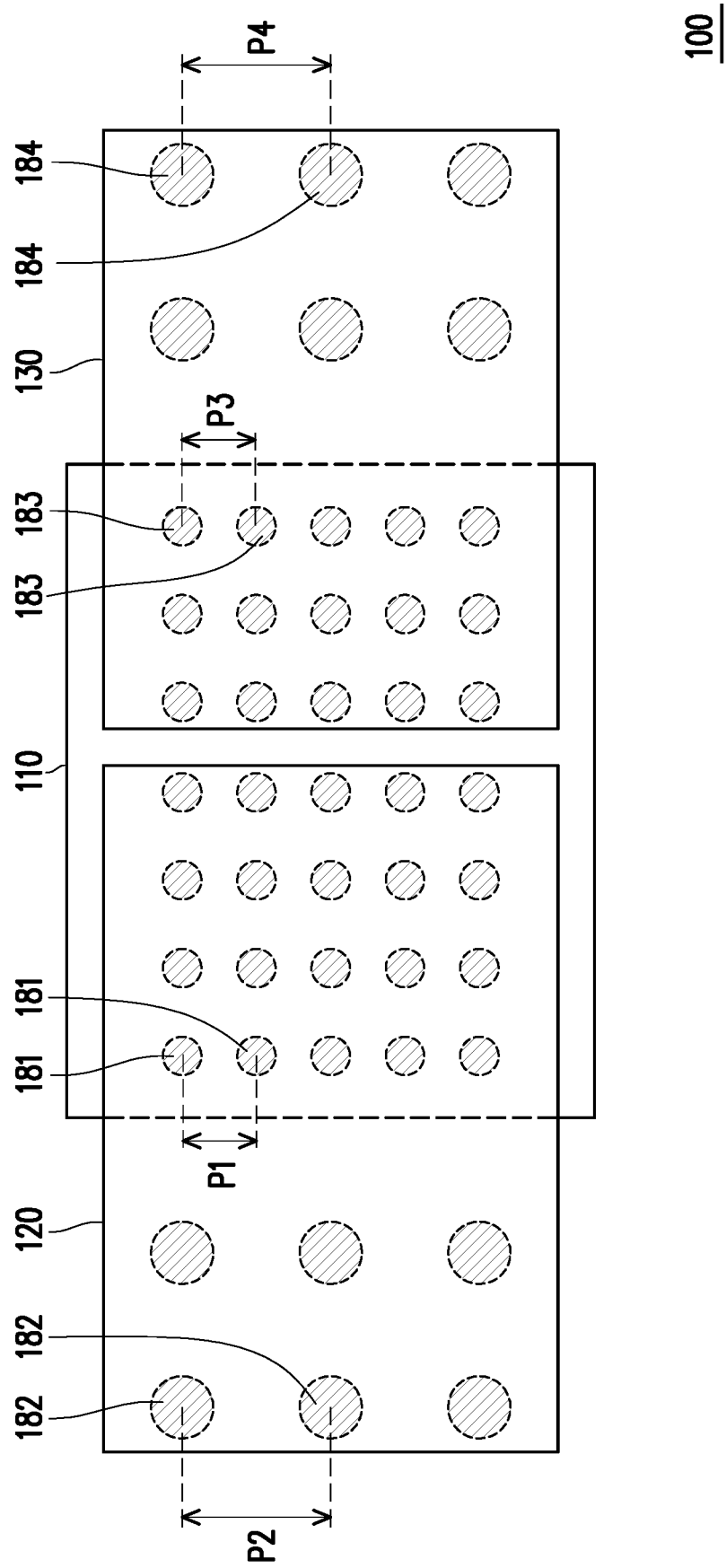
FIG. 1H is a schematic partial top view of the chip package structure according to the first embodiment of the disclosure.
Figure 1I:
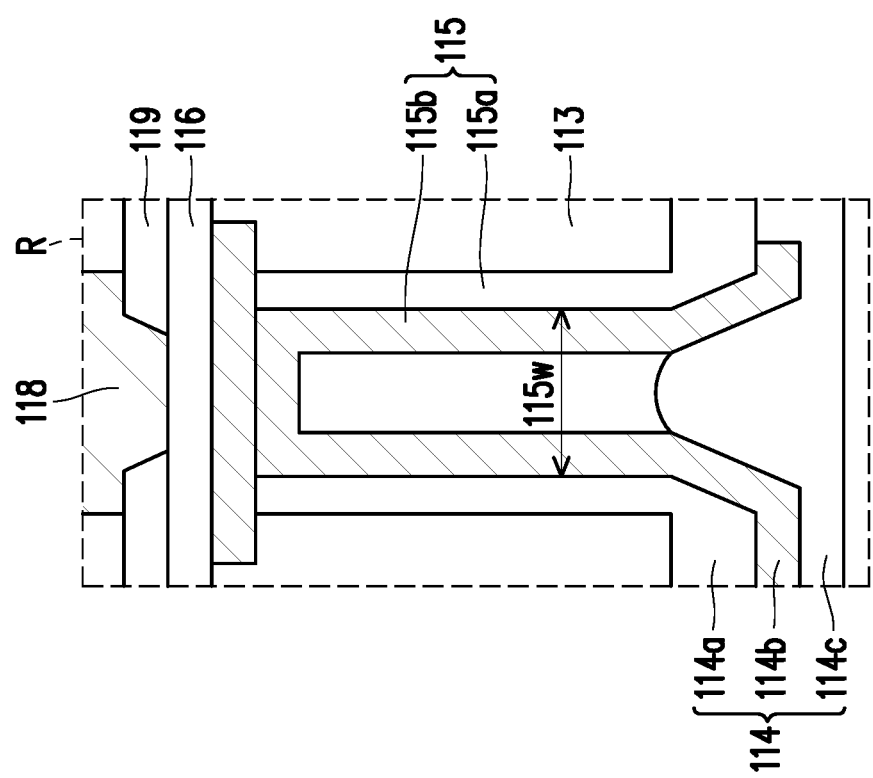
FIG. 1I is a schematic partial cross-sectional view illustrating part of the manufacturing method of the chip package structure according to the first embodiment of the disclosure.

With reference to FIG. 1G, after the second redistribution layer 170 is formed, the carrier substrate 191 (shown in FIG. 1F) may be removed to expose the first redistribution layer 160.

It is worth noting that the disclosure does not limit a sequence in which the second chip 120 is disposed on the second redistribution layer 170, the third chip 130 is disposed on the second redistribution layer 170 and the carrier substrate 191 is removed. In the present embodiment, the second chip 120 and the third chip 130 may be disposed on the second redistribution layer 170 first, and then the carrier substrate 191 may be removed. In an embodiment not shown, the carrier substrate 191 may be removed first, and then the second chip 120 or the third chip 130 may be disposed on the second redistribution layer 170.

With continued reference to reference FIG. 1G, after the first redistribution layer 160 is exposed, fifth conductive terminals 185 may be formed on the first redistribution layer 160.

In an embodiment, the fifth conductive terminals 185 may include solder balls, but the disclosure is not limited thereto.

In an embodiment, the fifth conductive terminals 185 may be formed by a commonly used ball mounting process, which is omitted herein.

After the above process, a manufacturing of a chip package structure 100 of the present embodiment can be substantially completed. With reference to FIG. 1G and FIG. 1H, the chip package structure 100 includes the first chip 110, the encapsulant 140, the first redistribution layer 160, the second redistribution layer 170, the second chip 120, and the third chip 130. The first chip 110 has the first active surface 111, the first back side surface 112, the conductive vias 115, and the first conductive connectors 117. The first back side surface 112 is opposite to the first active surface 111. The first conductive connectors 117 are located on the first back side surface 112. The encapsulant 140 covers the first active surface 111, the first back side surface 112, and the conductive connectors 117 of the first chip 110. The encapsulant 140 has a first encapsulating surface 141 and a second encapsulating surface 142. The second encapsulating surface 142 is opposite to the first encapsulating surface 141. The first redistribution layer 160 is located on the first encapsulating surface 141 of the encapsulant 140. The second redistribution layer 170 is located on the second encapsulating surface 142 of the encapsulant 140. The second chip 120 is disposed on the second redistribution layer 170. The third chip 130 is disposed on the second redistribution layer 170.

In the present embodiment, the first chip 110 may be an active die, but the disclosure is not limited thereto. In an embodiment, the first chip 110 may be a bridge die for interconnecting the second chip 120 and the third chip 130.

In the present embodiment, the first chip 110 may further have the second conductive connectors 118 on the first active surface 111. The encapsulant 140 further covers the second conductive connectors 118.

In the present embodiment, the first chip 110 may further have the circuit structure 114 located on the first back side surface 112, and the first conductive connectors 117 are electrically connected to the corresponding conductive vias 115 through a corresponding portion of the circuit structure 114.

In the present embodiment, the conductive vias 115 may include the via insulating layers 115a (shown in FIG. 1I) and the via conductive layers 115b (shown in FIG. 1I), the circuit structure 114 may include the circuit insulating layer 114a (shown in FIG. 1I) and the circuit conductive layer 114b (shown in FIG. 1I), the via insulating layer 115a and the circuit insulating layer 114a may be a same layer, and the via conductive layer 115b and the circuit conductive layer 114b may be a same layer.

In the present embodiment, the chip package structure 100 may further include the third conductive connectors 150. The third conductive connectors 150 penetrate through the encapsulant 140. The third conductive connectors 150 are electrically connected to a portion of the first redistribution layer 160 and a portion of the second redistribution layer 170. A diameter of the third conductive connectors 150 (for example, a minimum diameter 150w) is greater than a diameter of the conductive vias 115 (for example, a minimum diameter 115w; shown in FIG. 1I).

In an embodiment, the minimum diameter 150w of the third conductive connectors 150 is greater than the minimum diameter 115w of the conductive vias 115 (shown in FIG. 1I). That is, a maximum transmission current value of the third conductive connectors 150 may be greater than a maximum transmission current value of the conductive vias 115. Therefore, the third conductive connectors 150 may be suitable for (but not limited to) transmission of a larger current (compared to the maximum transmission current value of the conductive vias 115) for a power supply, a ground terminal or the like, and the conductive vias 115 may be suitable for (but not limited to) transmission of a smaller current (compared to the maximum transmission current value of the third conductive connectors 150) for a signal or the like.

In the present embodiment, the chip package structure 100 may further include the first conductive terminals 181 and the second conductive terminals 182. The first conductive terminals 181 are located between the second chip 120 and the second redistribution layer 170, and the first conductive terminals 181 overlap the first chip 110. The second conductive terminals 182 are located between the second chip 120 and the second redistribution layer 170, and the second conductive terminals 182 do not overlap the first chip 110. The two adjacent first conductive terminals 181 have a first pitch P1 therebetween, the two adjacent second conductive terminals 182 have a second pitch P2 therebetween, and the first pitch P1 is smaller than the second pitch P2.

In the present embodiment, in a plan view (as shown in FIG. 1H), a projection area of each of the first conductive terminals 181 may be smaller than a projection area of each of the second conductive terminals 182. For example, the projection area of each of the first conductive terminals 181 projected on the second encapsulating surface 142 (or a virtual surface parallel to the first encapsulating surface 141) may be smaller than the projection area of each of the second conductive terminals 182 projected on the second encapsulating surface 142 (or a virtual surface parallel to the first encapsulating surface 141).

In an embodiment, the first conductive terminals 181 are electrically connected to the corresponding conductive vias 115, and the second conductive terminals 182 are electrically connected to the corresponding third conductive connectors 150. Besides, the minimum diameter 150w of the third conductive connectors 150 is greater than the minimum diameter 115w of the conductive vias 115, and the projection area of each of the second conductive terminals 182 is greater than the projection area of each of the first conductive terminals 181. Therefore, the third conductive connectors 150 and the corresponding second conductive terminals 182 may be suitable for (but not limited to) transmission of a larger current for a power supply, a ground terminal or the like, and the conductive vias 115 and the corresponding first conductive terminals 181 may be suitable for (but not limited to) transmission of a smaller current for a signal or the like.

In the present embodiment, the chip package structure 100 may further include the third conductive terminals 183 and the fourth conductive terminals 184. The third conductive terminals 183 are located between the third chip 130 and the second redistribution layer 170, and the third conductive terminals 183 overlap the first chip 110. The fourth conductive terminals 184 are located between the third chip 130 and the second redistribution layer 170, and the fourth conductive terminals 184 do not overlap the first chip 110. The two adjacent third conductive terminals 183 have a third pitch P3 therebetween, the two adjacent fourth conductive terminals 184 have a fourth pitch P4 therebetween, and the third pitch P3 is smaller than the fourth pitch P4.

In the present embodiment, in a plan view (as shown in FIG. 1H), a projection area of each of the third conductive terminals 183 may be smaller than a projection area of each of the fourth conductive terminals 184. For example, the projection area of each of the third conductive terminals 183 projected on the second encapsulating surface 142 (or a virtual surface parallel to the first encapsulating surface 141) may be smaller than the projection area of each of the fourth conductive terminals 184 projected on the second encapsulating surface 142 (or a virtual surface parallel to the first encapsulating surface 141).

In an embodiment, the third conductive terminals 183 are electrically connected to the corresponding conductive vias 115, and the fourth conductive terminals 184 are electrically connected to the corresponding third conductive connectors 150. Besides, the minimum diameter 150w of the third conductive connectors 150 is greater than the minimum diameter 115w of the conductive vias 115, and the projection area of each of the fourth conductive terminals 184 is greater than the projection area of each of the third conductive terminals 183. Therefore, the third conductive connectors 150 and the corresponding fourth conductive terminals 184 may be suitable for transmission of a larger current for a power supply, a ground terminal or the like, and the conductive vias 115 and the corresponding third conductive terminals 183 may be suitable for transmission of a smaller current for a signal or the like.

In the present embodiment, the first active surface 111 of the first chip 110, the second active surface 121 of the second chip 120, and the third active surface 131 of the third chip 130 may face the second redistribution layer 170. In this way, a signal transmission path between the first chip 110 and the second chip 120 and between the first chip 110 and the third chip 130 can be reduced, and the quality or efficiency of signal transmission can be improved.

In an embodiment, the second chip 120 and the third chip 130 may be homogeneous chips or heterogeneous chips, which is not limited in the disclosure. For example, the second chip 120 and the third chip 130 may be dies, packaged chips, stacked chip packages, or application-specific integrated circuits (ASICs) with the same or different functions, but the disclosure is not limited thereto.

FIG. 2A to FIG. 2F are schematic partial cross-sectional views illustrating part of a manufacturing method of a chip package structure according to a second embodiment of the disclosure. In the present embodiment, a manufacturing method of a chip package structure 200 is similar to the manufacturing method of the chip package structure 100 of the first embodiment. Similar components are denoted by the same reference numerals, and have similar functions, materials, or formation manners, and the descriptions are omitted. Specifically, FIG. 2A to FIG. 2F are schematic partial cross-sectional views illustrating part of the manufacturing method of the chip package structure subsequent to a step of FIG. 1A.

Figure 2A:
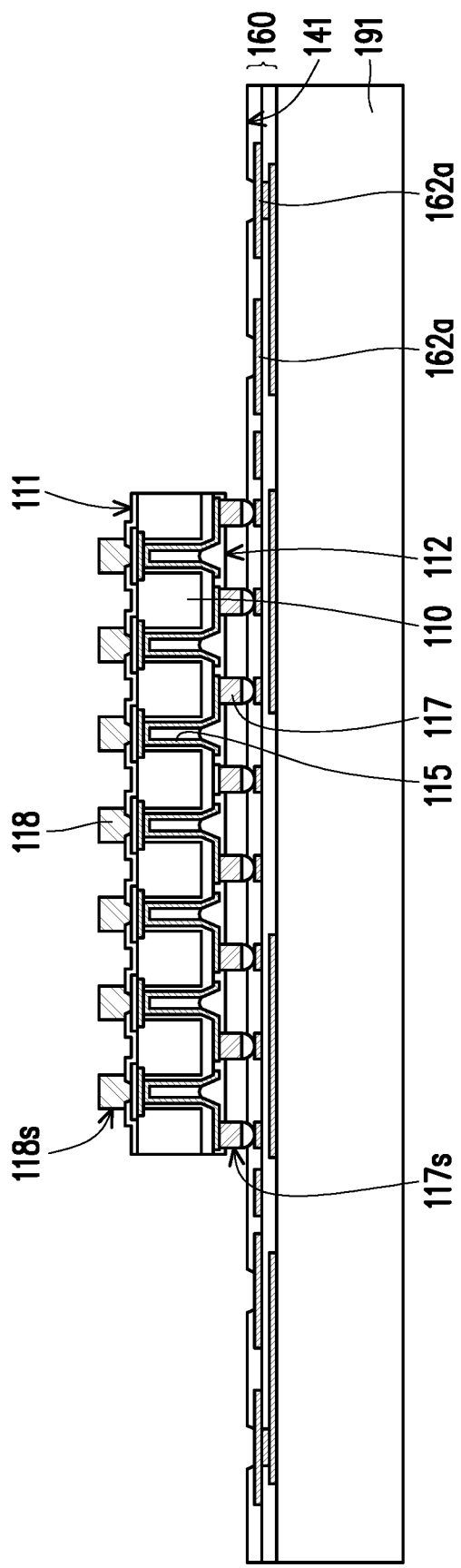
FIG. 2A to FIG. 2F are schematic partial cross-sectional views illustrating part of a manufacturing method of a chip package structure according to a second embodiment of the disclosure.

Subsequent to FIG. 1A, with reference to FIG. 2A, in the present embodiment, a first chip 110 is disposed on a first redistribution layer 160.

Figure 2B:
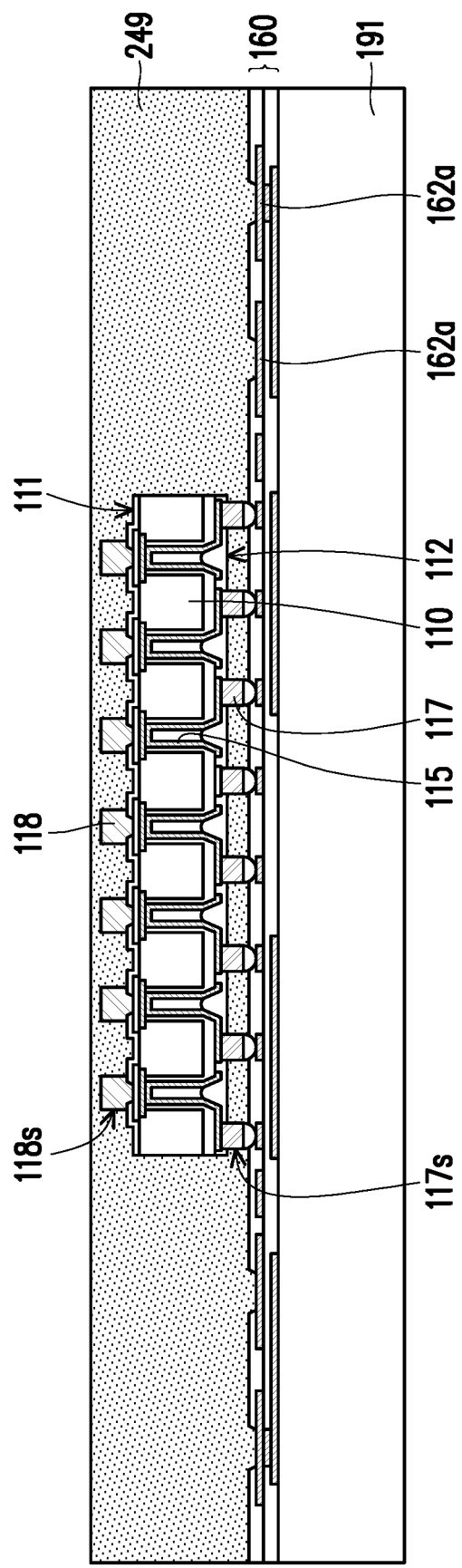

With reference to FIG. 2B, in the present embodiment, an encapsulating material 249 may be formed on the first redistribution layer 160. The encapsulating material 249 covers a first active surface 111, a first back side surface 112, side walls 117s of a plurality of first conductive connectors 117, and side walls 118s of a plurality of second conductive connectors 118 of the first chip 110.

In the present embodiment, the encapsulating material 249 may further cover an end of the second conductive connector 118 opposite to the carrier substrate 191, but the disclosure is not limited thereto. In an embodiment not shown, the encapsulating material 249 may expose the end of the second conductive connector 118 opposite to the carrier substrate 191.

Figure 2C:
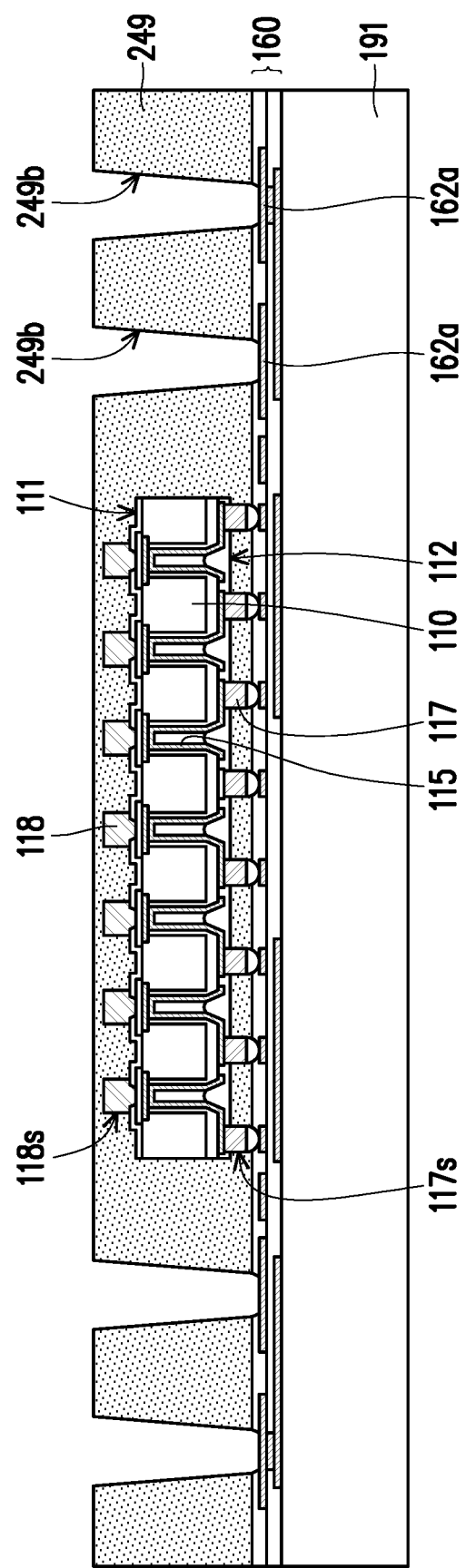

With reference to FIG. 2C, in the present embodiment, a portion of the encapsulating material 249 may be removed by laser drilling, etching, or other suitable manners to form a plurality of openings 249b, and the openings 249b may expose a portion of a topmost conductive layer 162a.

Figure 2D:
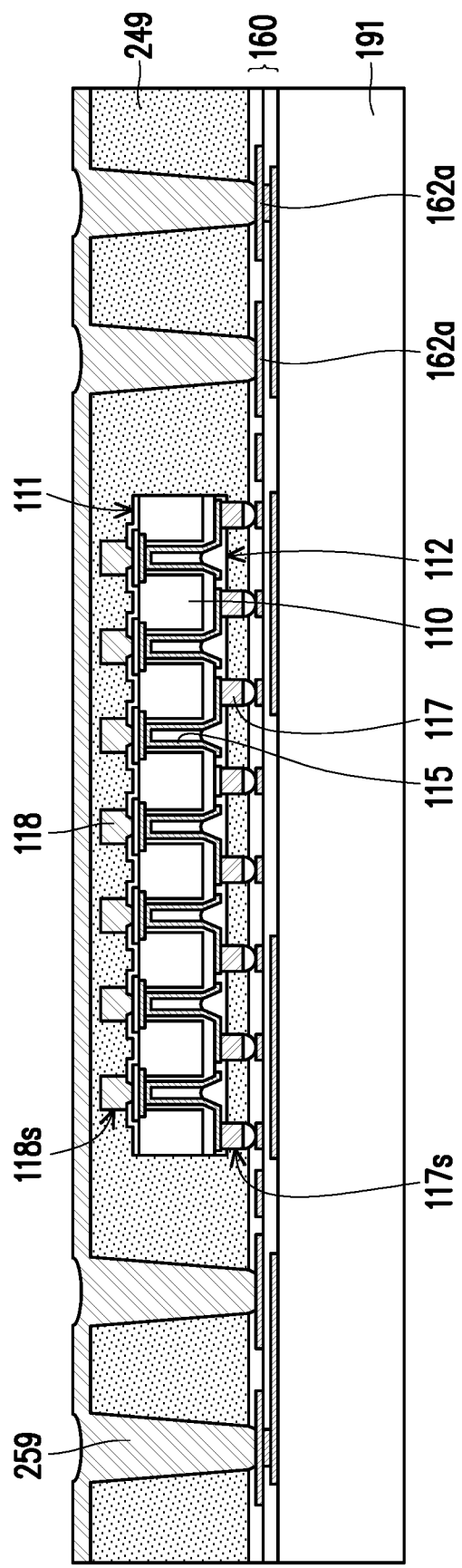

With reference to FIG. 2D, in the present embodiment, a conductive material 259 may be filled into the opening 249b (shown in FIG. 2C) by a commonly used semiconductor process (such as a deposition process and/or a plating process). The conductive material 259 filled into the opening 249b may be electrically connected to a portion of the topmost conductive layer 162a.

In the present embodiment, the conductive material 259 may further cover a surface of the encapsulating material 249 opposite to the carrier substrate 191, but the disclosure is not limited thereto. In an embodiment not shown, the conductive material 259 may expose a surface of the encapsulating material 249 opposite to the carrier substrate 191.

Figure 2E:
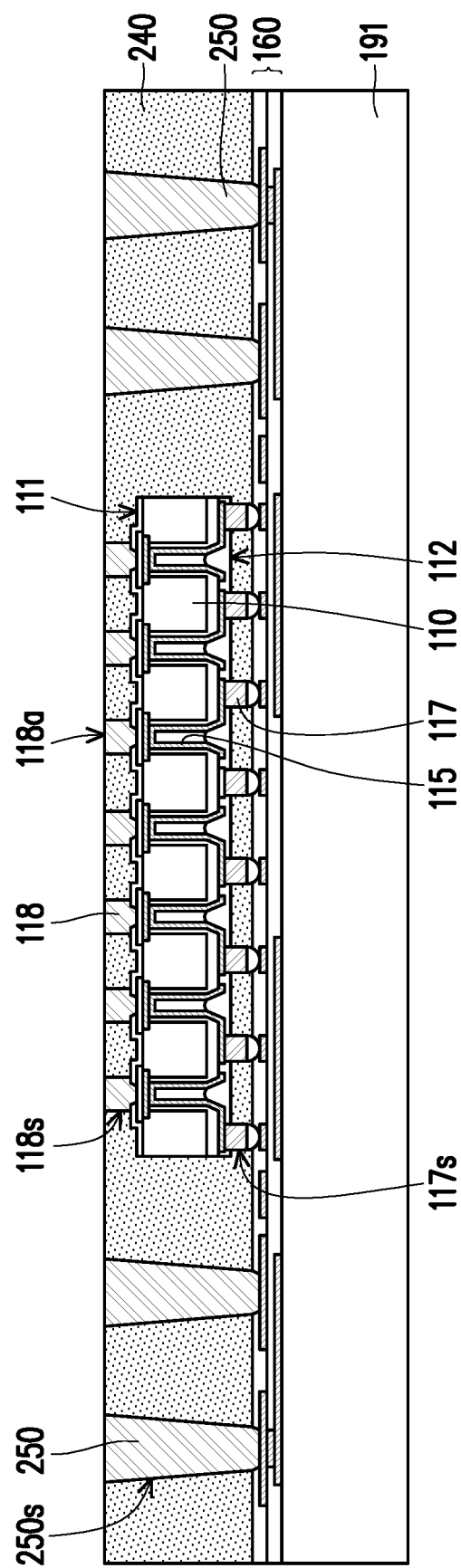

With reference to FIG. 2E, in the present embodiment, if the conductive material 259 (shown in FIG. 2D) completely covers the surface of the encapsulating material 249 (shown in FIG. 2D) opposite to the carrier substrate 191, a portion of the conductive material 259 may be removed by etching, grinding, polishing, or other suitable manners to expose the surface of the encapsulating material 249 opposite to the carrier substrate 191.

With continued reference to FIG. 2E, in the present embodiment, if the encapsulating material 249 (shown in FIG. 2C) completely covers the end of the second conductive connector 118 opposite to the carrier substrate 191, etching, grinding, polishing, or other suitable manners may be used to expose the end of the second conductive connector 118 opposite to the carrier substrate 191.

In the present embodiment, if the conductive material 259 (shown in FIG. 2C) completely covers the surface of the encapsulating material 249 (shown in FIG. 2C) opposite to the carrier substrate 191, and the encapsulating material 249 completely covers the end of the second conductive connector 118 opposite to the carrier substrate 191, then a plurality of third conductive connectors 250 and an encapsulant 240 covering side walls 250s of the third conductive connectors 250 may be formed by the foregoing steps.

In an embodiment, the third conductive connector 250 may be referred to as a through mold via (TMV), but the disclosure is not limited thereto.

Figure 2F:
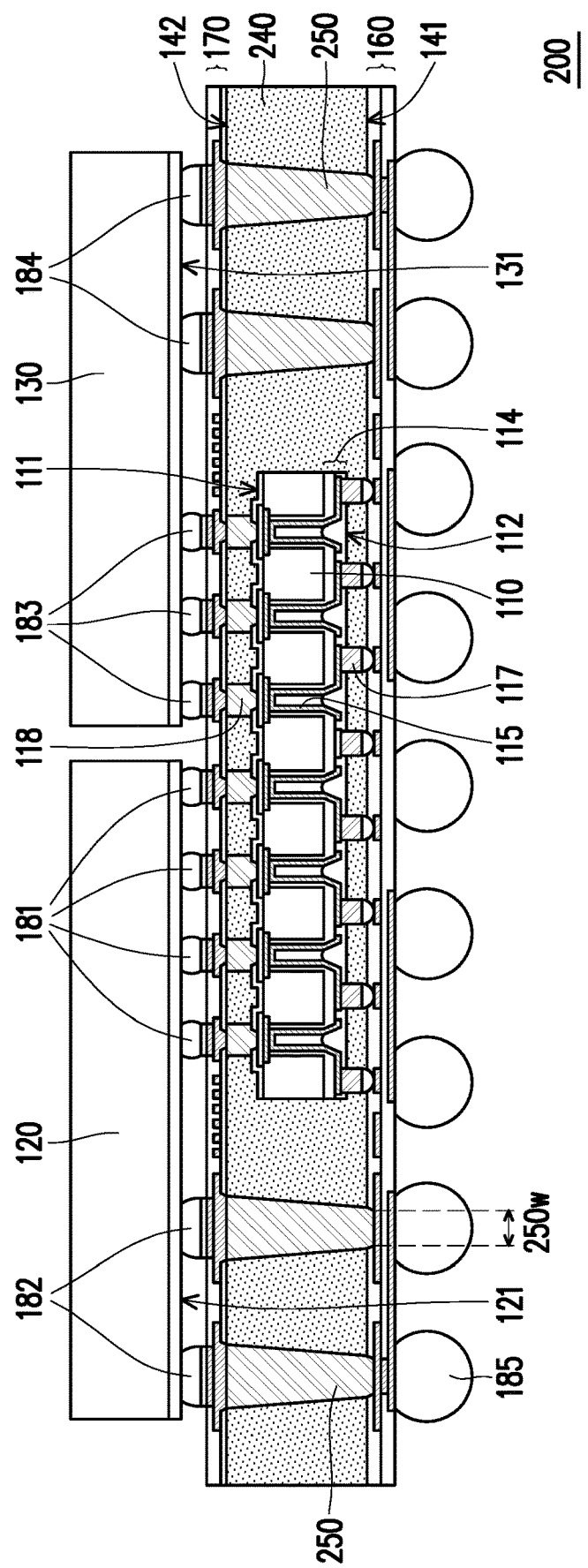

After the third conductive connectors 250 and the encapsulant 240 are formed, steps similar to those shown in FIG. 1F to FIG. 1G may be used to form the chip package structure 200 shown in FIG. 2F.

With reference to FIG. 2F, the chip package structure 200 may include the first chip 110, the encapsulant 240, the first redistribution layer 160, the second redistribution layer 170, the second chip 120, the third chip 130, and the third conductive connectors 250. The third conductive connectors 250 penetrate through the encapsulant 240. The third conductive connectors 250 are electrically connected to a portion of the first redistribution layer 160 and a portion of the second redistribution layer 170.

In the present embodiment, a diameter of the third conductive connectors 250 (for example, a minimum diameter 250w) may be greater than a diameter of the conductive vias 115 (for example, a minimum diameter 115w; shown in FIG. 1I).

In the present embodiment, the second conductive terminals 182 may be electrically connected to the corresponding third conductive connectors 250, and the fourth conductive terminals 184 are electrically connected to the corresponding third conductive connectors 250.

A layout design of the circuit layer or circuit structure (for example, the circuit structure 114, the first redistribution layer 160, and/or the second redistribution layer 170) of the foregoing embodiments may be adjusted according to requirements in applications. That is, the circuits that are not directly connected in the drawings may be electrically connected on other cross sections or in other regions through other structures (such as conductive vias) or components.

Based on the above, the chip package structure and the manufacturing method of the chip package structure of the disclosure can facilitate signal transmission quality or efficiency.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. A chip package structure, comprising:
 a first chip, comprising a first active surface, a first back side surface opposite to the first active surface, a plurality of conductive vias, and a plurality of first conductive connectors located on the back side surface;
 an encapsulant, covering the first active surface, the first back side surface, and the first conductive connectors of the first chip, the encapsulant comprising a first encapsulating surface and a second encapsulating surface opposite to the first encapsulating surface;
 a first redistribution layer, located on the first encapsulating surface of the encapsulant;
 a second redistribution layer, located on the second encapsulating surface of the encapsulant;
 a second chip, disposed on the second redistribution layer;
 a third chip, disposed on the second redistribution layer;
 a plurality of first conductive terminals, located between the second chip and the second redistribution layer; and
 a plurality of second conductive terminals, located between the second chip and the second redistribution layer, wherein
 the first conductive terminals overlap the first chip;
 the second conductive terminals do not overlap the first chip; and
 a pitch of the first conductive terminals is smaller than a pitch of the second conductive terminals.

2. The chip package structure according to claim 1, wherein the first chip further comprises a plurality of second conductive connectors located on the first active surface, and the encapsulant further covers the second conductive connectors.

3. The chip package structure according to claim 1, further comprising:
 a plurality of third conductive connectors, penetrating through the encapsulant and electrically connected to a portion of the first redistribution layer and a portion of the second redistribution layer, wherein a diameter of the third conductive connectors is greater than a diameter of the conductive vias.

4. The chip package structure according to claim 1, wherein in a plan, a projection area of each of the first conductive terminals is smaller than a projection area of each of the second conductive terminals.

5. The chip package structure according to claim 1, further comprising:
a plurality of third conductive terminals, located between the third chip and the second redistribution layer; and
a plurality of fourth conductive terminals, located between the third chip and the second redistribution layer, wherein
the third conductive terminals overlap the first chip;
the fourth conductive terminals do not overlap the first chip; and
a pitch of the third conductive terminals is smaller than a pitch of the fourth conductive terminals.

6. The chip package structure according to claim 5, wherein in a plan view, a projection area of each of the third conductive terminals is smaller than a projection area of each of the fourth conductive terminals.

7. The chip package structure according to claim 1, wherein
the second chip comprises a second active surface;
the third chip comprises a third active surface; and
the first active surface of the first chip, the second active surface of the second chip, and the third active surface of the third chip face the second redistribution layer.

8. The chip package structure according to claim 1, wherein the first chip further comprises a circuit structure located on the first back side surface, and the first conductive connectors are electrically connected to the corresponding conductive vias through the circuit structure.

9. The chip package structure according to claim 8, wherein
the conductive vias comprise via insulating layers and via conductive layers;
the circuit structure comprises a circuit insulating layer and a circuit conductive layer;
the via insulating layer and the circuit insulating layer are a same layer; and
the via conductive layer and the circuit conductive layer are a same layer.

10. The chip package structure according to claim 1, wherein the first chip is an active die or a bridge die.

11. A manufacturing method of a chip package structure, comprising:
forming a first redistribution layer on a carrier substrate;
forming a plurality of third conductive connectors on the first redistribution layer, the third conductive connectors being electrically connected to the first redistribution layer;
disposing a first chip on the first redistribution layer, the first chip comprising a first active surface, a first back side surface opposite to the active surface, a plurality of conductive vias, and a plurality of first conductive connectors located on the first back side surface, and the first conductive connectors being electrically connected to the first redistribution layer;
forming an encapsulant on the first redistribution layer, the encapsulant covering the first active surface, the first back side surface, and the first conductive connectors of the first chip, and the encapsulant further covering the third conductive connectors;
forming a second redistribution layer on the encapsulant;
disposing a second chip on the second redistribution layer; and
disposing a third chip on the second redistribution layer.

12. The chip package structure according to claim 11, wherein the first chip further comprises a plurality of second conductive connectors located on the first active surface, and the encapsulant further covers the second conductive connectors.

13. The chip package structure according to claim 12, wherein forming the encapsulant comprises:
forming an encapsulating material on the first redistribution layer, the encapsulating material covering the first active surface, the first back side surface, the first conductive connectors, and the second conductive connectors of the first chip; and
removing a portion of the encapsulating material to expose a portion of the second conductive connectors and form the encapsulant.

14. The chip package structure according to claim 11, wherein forming the encapsulant comprises:
forming an encapsulating material on the first redistribution layer, the encapsulating material covering the third conductive connectors;
removing a portion of the encapsulating material to expose a portion of the third conductive connectors and form the encapsulant.

15. The chip package structure according to claim 11, wherein forming the encapsulant comprises:
forming an encapsulant material on the first redistribution layer, the encapsulant material covering the first active surface, the first back side surface, and the first conductive connectors of the first chip;
removing a portion of the encapsulating material to form a plurality of openings so as to expose a portion of the first redistribution layer; and
filling a conductive material into the openings to form the plurality of third conductive connectors and the encapsulant covering the third conductive connectors.

16. The chip package structure according to claim 15, wherein the step of forming the encapsulant further comprises:
filling the conductive material into the openings and onto the encapsulating material; and
removing a portion of the conductive material and a portion of the encapsulating material to form the third conductive connectors and the encapsulant covering the third conductive connectors.

17. The chip package structure according to claim 11, wherein the first chip further comprises a circuit structure located on the first back side surface, and the first conductive connectors are electrically connected to the corresponding conductive vias through the circuit structure.

18. The chip package structure according to claim 17, wherein
the conductive vias comprise via insulating layers and via conductive layers;
the circuit structure comprises a circuit insulating layer and a circuit conductive layer;
the via insulating layer and the circuit insulating layer are a same layer; and
the via conductive layer and the circuit conductive layer are a same layer.

* * * * *